United States Patent
Brown et al.

(10) Patent No.: US 9,612,287 B2
(45) Date of Patent: Apr. 4, 2017

(54) NON-SEQUENTIAL MONITORING OF BATTERY CELLS IN BATTERY MONITORING SYSTEMS, AND RELATED COMPONENTS, SYSTEMS, AND METHODS

(75) Inventors: David Brown, Raleigh, NC (US); Christopher James Belcher, Cary, NC (US); Duncan Joseph Brown, Raleigh, NC (US); Dat Tan Chau, Raleigh, NC (US)

(73) Assignee: NDSL, Inc., Raleigh, NC (US)

( * ) Notice: Subject to any disclaimer, the term of this patent is extended or adjusted under 35 U.S.C. 154(b) by 876 days.

(21) Appl. No.: 13/461,862

(22) Filed: May 2, 2012

(65) Prior Publication Data
US 2013/0293995 A1 Nov. 7, 2013

(51) Int. Cl.
*H02J 7/00* (2006.01)
*G01R 31/36* (2006.01)
*H02J 9/04* (2006.01)

(52) U.S. Cl.
CPC ..... *G01R 31/3631* (2013.01); *G01R 31/3658* (2013.01); *G01R 31/3662* (2013.01); *H02J 7/0021* (2013.01); *H02J 9/04* (2013.01)

(58) Field of Classification Search
CPC ............ G01R 31/3631; G01R 31/3658; G01R 31/3662; H02J 7/0021; H02J 9/04
See application file for complete search history.

(56) References Cited

U.S. PATENT DOCUMENTS

| | | |
|---|---|---|
| 4,086,392 A | 4/1978 | Mao et al. |
| 4,707,795 A | 11/1987 | Alber et al. |
| 5,589,757 A | 12/1996 | Klang |
| 6,094,030 A | 7/2000 | Gunthorpe et al. |
| 7,811,701 B2 | 10/2010 | Yao |

(Continued)

FOREIGN PATENT DOCUMENTS

| | | |
|---|---|---|
| WO | 9815821 A1 | 4/1998 |
| WO | 2011115640 A1 | 9/2011 |

OTHER PUBLICATIONS

International Preliminary Report on Patentability for International Patent Application No. PCT/US13/38975 mailed Nov. 13, 2014, 11 pages.

(Continued)

*Primary Examiner* — Nha Nguyen
(74) *Attorney, Agent, or Firm* — Withrow & Terranova, PLLC

(57) ABSTRACT

Non-sequential monitoring of battery cells in battery monitoring systems, and related components, systems, and methods are disclosed. In one embodiment, a battery monitoring system control unit is provided. The battery monitoring system control unit is configured to control battery monitoring devices. Each battery monitoring device is configured to be coupled to a subset of battery cells electrically connected in series in a sequential order to form a battery. The battery monitoring system control unit is further configured to instruct the battery monitoring devices to test an ohmic value of each battery cell of the battery cells of the battery in a non-sequential order. In this manner, heat generated in the battery monitoring devices from the testing may be more effectively dissipated, which can also allow for the battery monitoring devices to be employed in higher operating temperature environments.

33 Claims, 6 Drawing Sheets

(56) References Cited

U.S. PATENT DOCUMENTS

| | | | |
|---|---|---|---|
| 7,940,052 B2 | 5/2011 | Vonderhaar et al. | |
| 2006/0193095 A1 | 8/2006 | Hunter et al. | |
| 2006/0259280 A1 | 11/2006 | Zaccaria | |
| 2008/0290877 A1* | 11/2008 | Oh et al. | 324/426 |
| 2010/0075207 A1 | 3/2010 | Yen | |
| 2010/0114512 A1 | 5/2010 | Cotton et al. | |
| 2010/0119955 A1* | 5/2010 | Abe et al. | 429/338 |
| 2012/0025769 A1* | 2/2012 | Kikuchi et al. | 320/118 |
| 2012/0068715 A1 | 3/2012 | Martaeng | |
| 2012/0116699 A1 | 5/2012 | Haag et al. | |
| 2012/0150464 A1 | 6/2012 | Swanton | |
| 2013/0041606 A1* | 2/2013 | Tang et al. | 702/63 |
| 2014/0242432 A1 | 8/2014 | Brown et al. | |

OTHER PUBLICATIONS

International Search Report and Written Opinion for PCT/US13/38975 mailed Oct. 1, 2013, 12 pages.
International Search Report and Written Opinion for PCT/US14/19360, mailed Jun. 20, 2014, 12 pages.
International Preliminary Report on Patentability for International Patent Application No. PCT/US2014/019360, mailed Sep. 11, 2015, 11 pages.
Notice of Allowance for U.S. Appl. No. 13/780,795, mailed Jan. 25, 2016, 6 pages.
Notice of Allowance for U.S. Appl. No. 13/780,795, mailed Nov. 10, 2015, 9 pages.

* cited by examiner

NON-SEQUENTIAL MONITORING OF BATTERY CELLS IN BATTERY MONITORING SYSTEMS, AND RELATED COMPONENTS, SYSTEMS, AND METHODS

BACKGROUND

I. Field of the Disclosure

The technology of the disclosure relates generally to battery monitoring systems for battery power systems, such as uninterrupted power supplies (UPSs).

II. Background

An industrial system may rely on an uninterrupted power supply (UPS) to provide backup power in the event of failure of a primary power system. The UPS may be provided in the form of a number of lead acid battery cells electrically connected in series. A battery charger is provided that keeps the battery cells charged in the event backup power is needed from the battery cells. However, each battery cell will eventually fail. For example, lead acid batteries may lose the ability to accept a charge when discharged over time due to sulfation. A battery containing one or more failed battery cells may be unable to power the industrial system at specified battery operating voltages, at specified battery operating currents, and/or for specified battery time durations.

Accordingly, an industrial system may employ a battery monitoring system to monitor the state-of-health (SOH) of battery cells in a backup power supply. The state-of-health (SOH) of a battery cell may be correlated with an ohmic value of the battery cell, such as an internal resistance, internal impedance, and/or internal conductance of the battery cell. For example, an increased internal resistance, increased internal impedance, and/or decreased internal conductance of a battery cell may be used to detect an impending failure or failure of the battery cell. A battery cell which has been detected to have the impending failure or to have failed may be replaced.

In this regard, FIG. 1 illustrates a battery monitoring system 10. The battery monitoring system 10 comprises a battery monitoring device 14 and a control unit 12 for controlling the battery monitoring device 14. The battery monitoring device 14 is configured to test ohmic values 17 of battery cells 18 of a backup power supply provided in the form of a battery 16. The battery 16 is comprised of a plurality of battery cells 18(1)-18(4) electrically connected in series. Each battery monitoring device 14 may be coupled to a subset 19 of battery cells 18 electrically connected in series and in a sequential order to form the battery 16. The subset 19 may comprise a battery cell substring comprising a unique set of battery cells 18 of the battery 16. The battery monitoring device 14 provides a pair of current-inducing leads L1, L2 configured to be coupled to the negative and positive terminals of a battery cell substring of the battery 16. The control unit 12 may instruct the battery monitoring device 14 to produce a current through the subset 19 of battery cells 18 (as a non-limiting example, battery cells 18(1)-18(4)) by activating a switch to place a resistive load in a current loop with the subset 19 of battery cells 18 (as a non-limiting example, battery cells 18(1)-18(4)) of the battery 16.

The battery monitoring device 14 also provides a plurality of voltage sensing leads V1-V5. The voltage sensing leads V1-V5 are configured to be coupled to measure a voltage across the negative and positive terminals of each battery cell 18(1)-18(4). As illustrated in FIG. 1, voltage leads V1-V5 have resistances $R_{V1}$-$R_{V5}$ and current leads L1-L2 have resistances $R_{L1}$-$R_{L2}$. To increase the accuracy of measured voltages, the battery monitoring device 14 may employ Kelvin sensing. In this regard, separate voltage leads V1, V5 (for sensing voltages) may optionally be provided separate from the current leads L1, L2. Providing the current leads L1, L2 separate from the voltage leads V1-V5 allows the voltages measured by the voltage leads V1-V5 to be more accurate than a system in which a single lead is used for both L1 and V1 and another single lead is used for both L2 and V5. This is because separating the current lead L1 from the voltage lead V1 and separating the current lead L2 from the voltage lead V5 significantly reduces the impedance contribution of the voltage leads V1, V5. Because there is almost no current flow in the voltage leads V1, V5, the voltage drop across the voltage leads V1, V5 (i.e., across $R_{V1}$ and $R_{V5}$) is lower. As a result, using separate current leads L1, L2 and voltage leads V1, V5 enables a more accurate measurement of the voltages across the battery cells 18(1)-18(4).

The battery monitoring device 14 may test an ohmic value 17 of a battery cell 18 by inducing a series of current pulses through the subset 19 of battery cells 18 assigned to the battery monitoring device 14. The battery monitoring device 14 may induce the series of current pulses at a predetermined frequency for a predetermined period of time. As a non-limiting example, the series of current pulses may draw a predetermined amount of current from the subset 19 of battery cells 18. This pulse series may allow the battery monitoring device 14 to discriminate effects of the pulse series from the noise generated by other loads pulling current from the battery 16 and/or generator(s) charging the battery cells 18 of the battery 16.

In order to determine the state-of-health (SOH) of each battery cell 18 of the battery 16, the battery monitoring system 10 tests the ohmic value 17 (as non-limiting examples, ohmic values 17(1)-17(4)) of each battery cell 18 (as a non-limiting example, battery cells 18(1)-18(4)) in a sequential order (as a non-limiting example, in the order 18(1), 18(2), 18(3), 18(4)). As a result, during each test, an amount of heat (i.e., a number of joules) is generated from the resistive load of the battery monitoring device 14.

SUMMARY OF THE DISCLOSURE

Embodiments disclosed in the detailed description include non-sequential monitoring of battery cells in battery monitoring systems, and related components, systems, and methods. In this regard in one embodiment, a battery monitoring system control unit is provided. The battery monitoring system control unit is configured to control battery monitoring devices. Each battery monitoring device is configured to be coupled to a subset of battery cells electrically connected in series in a sequential order to form a battery. The battery monitoring system control unit is further configured to instruct the battery monitoring devices to test an ohmic value of each battery cell of the battery cells of the battery in a non-sequential order. In this manner, heat generated in the battery monitoring devices from the testing may be more effectively dissipated, which can also allow for the battery monitoring devices to be employed in higher operating temperature environments.

In another embodiment, a battery monitoring system is provided. The battery monitoring system comprises a battery comprised of battery cells electrically connected in series. The battery monitoring system further comprises battery monitoring devices. Each of the battery monitoring devices is configured to be coupled to a subset of the battery cells. The battery monitoring system further comprises at least one battery monitoring system control unit. The at least one battery monitoring system control unit is configured to instruct the battery monitoring devices to test an ohmic value of each battery cell of the battery cells of the battery in a non-sequential order.

In another embodiment, a method of a battery monitoring system control unit is provided. The method comprises instructing battery monitoring devices to test battery cells electrically connected in series in a sequential order to form a battery by testing an ohmic value of each battery cell of the battery cells of the battery in a non-sequential order.

In another embodiment, a non-transitory computer-readable medium is provided. The computer-readable medium has stored thereon computer-executable instructions to cause a processor to implement a method for controlling battery monitoring devices to test an ohmic value of each battery cell of a battery. The instructions comprise instructing battery monitoring devices to test battery cells electrically connected in series in a sequential order to form the battery by testing an ohmic value of each battery cell of the battery cells of the battery in a non-sequential order.

In another embodiment, a battery monitoring system for testing ohmic values of battery cells of a battery is provided. The battery monitoring system comprises battery monitoring devices. Each of the battery monitoring devices is configured to be coupled to a subset of battery cells electrically connected in series in a sequential order to form a battery. Each battery monitoring device comprises current leads. The current leads are configured to be coupled to the subset of battery cells assigned to the battery monitoring device to induce a current through the subset of battery cells. Each battery monitoring device further comprises voltage leads. The voltage leads are configured to be coupled to the subset of battery cells assigned to the battery monitoring device to measure a voltage of each battery cell of the subset. The battery monitoring system further comprises a battery monitoring system control unit configured to control the battery monitoring devices. Each of the battery monitoring devices is configured to be coupled to a fiber optic loop for communication with the battery monitoring system control unit. The battery monitoring system control unit is further configured to receive at least one pilot cell temperature measurement of the battery cells. The battery monitoring system control unit is further configured to receive at least one battery current measurement of the battery. The battery monitoring system control unit is further configured to instruct the battery monitoring devices to test an ohmic value of each battery cell of the battery cells of the battery in a non-sequential order.

DETAILED DESCRIPTION

Figure 1:
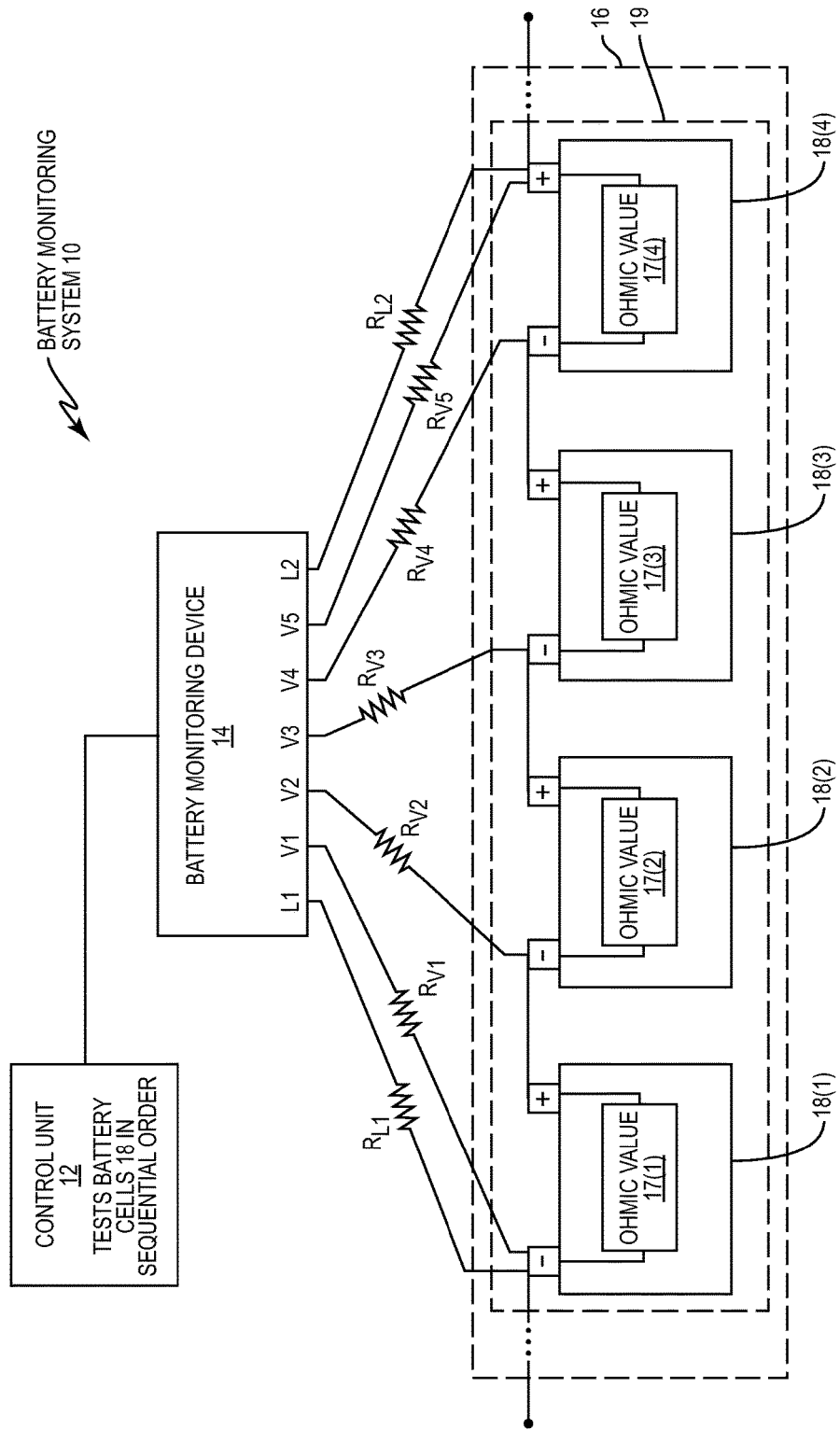
FIG. 1 is a block diagram of an exemplary battery monitoring system that includes battery cells electrically connected in series to form a backup power supply, a battery monitoring device, and a control unit for controlling the battery monitoring device.

With reference now to the drawing figures, several exemplary embodiments of the present disclosure are described. The word "exemplary" is used herein to mean "serving as an example, instance, or illustration." Any embodiment described herein as "exemplary" is not necessarily to be construed as preferred or advantageous over other embodiments.

Embodiments disclosed in the detailed description include non-sequential monitoring of battery cells in battery monitoring systems, and related components, systems, and methods. In this regard in one embodiment, a battery monitoring system control unit is provided. The battery monitoring system control unit is configured to control battery monitoring devices. Each battery monitoring device is configured to be coupled to a subset of battery cells electrically connected in series in a sequential order to form a battery. The battery monitoring system control unit is further configured to instruct the battery monitoring devices to test an ohmic value of each battery cell of the battery cells of the battery in a non-sequential order. The ohmic value of a battery cell may be an internal resistance of the battery cell, an internal impedance of the battery cell, and/or an internal conductance of the battery cell. In this manner, heat generated in the battery monitoring devices from the testing may be more effectively dissipated, which can also allow for the battery monitoring devices to be employed in higher operating temperature environments.

Figure 2:
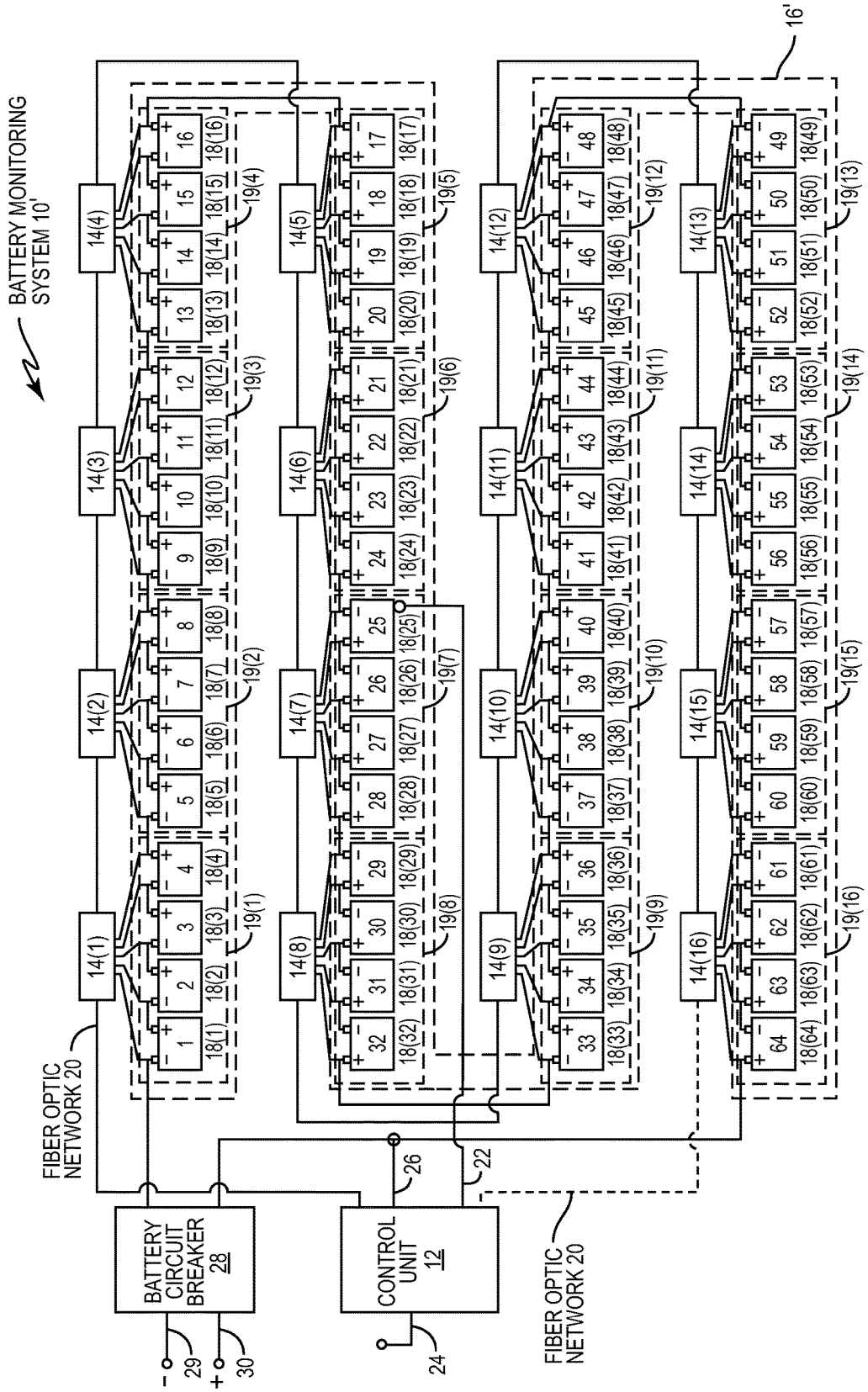
FIG. 2 is a block diagram of another exemplary battery monitoring system configured to test ohmic values of battery cells of a backup power supply in a sequential order.

Referring now to FIG. 2, a typical uninterrupted power supply for an industrial system may include a large number of battery cells 18 (for example, more than the four battery cells 18 (battery cells 18(1)-18(4)) depicted in FIG. 1). By having a large number of battery cells 18, the uninterrupted power supply may provide an increased amount of power, an increased duration of power, an increased amount of voltage, and/or an increased amount of current. In this regard, FIG. 2 illustrates an exemplary battery monitoring system 10' for monitoring a battery backup system comprising a large number of battery cells 18 (as a non-limiting example, battery cells 18(1)-18(64)). Because the battery 16' comprises a large number of battery cells 18, the battery monitoring system 10' may comprise a plurality of battery monitoring devices 14 (as a non-limiting example, battery monitoring devices 14(1)-14(16)). Because there are multiple battery monitoring devices 14, one or more battery monitoring system control units 12 may be provided to control the battery monitoring devices 14.

With continuing reference to FIG. 2, each battery monitoring device 14 may monitor a subset 19 (as a non-limiting example, a battery cell substring) of the battery cells 18 of the battery 16'. In this regard, the battery 16' comprises a plurality of battery cell subsets 19 of battery cells 18. Each subset 19 of battery cells 18 is assigned to be monitored by a different battery monitoring device 14. As illustrated in FIG. 2, each subset 19 of battery cells 18 may be comprised of a plurality of battery cells 18 electrically connected in series.

The battery monitoring system 10' is comprised of a plurality of battery monitoring devices 14(1)-14(16) that are each controlled by a control unit 12. The battery monitoring devices 14(1)-14(16) are coupled to a fiber optic network 20. The fiber optic network 20 is provided in lieu of an electricity-conducting network 20 so that electricity stored in the battery cells 18 (as a non-limiting example, battery cells 18(1)-18(64)) is unable to be conducted through the fiber optic network 20 connecting the plurality of battery monitoring devices 14(1)-14(16) and the control unit 12. As illustrated in FIG. 2, the fiber optic network 20 may form a fiber optic loop. In this regard, two interface ports of the control unit 12 may be coupled to the fiber optic network 20.

In another embodiment, the fiber optic network 20 may not form a fiber optic loop. In this embodiment, the control unit 12 may have a single interface port connecting the control unit 12 to the plurality of battery monitoring devices 14(1)-14(16) to network the control unit 12 and the battery monitoring devices 14(1)-14(16) together.

The control unit 12 may also comprise a battery cell temperature sensor(s) 22 and/or an ambient temperature sensor(s) 24. The battery cell temperature sensor(s) 22 may be coupled to at least one battery cell (as a non-limiting example, battery cell 18(25)) of the battery 16' for measuring one or more pilot temperatures of the battery 16'. The control unit 12 may also comprise a current sensor(s) 26 for sensing current of the battery 16'.

The battery monitoring system 10' may also comprise a battery circuit breaker 28 for protecting the battery 16' from overcurrents. The battery circuit breaker 28 may also provide a negative terminal 29 of the battery 16' and a positive terminal 30 of the battery 16' for external loading. In some embodiments, the battery monitoring system 10' may comprise two or more battery circuit breakers 28. The two or more battery circuit breakers 28 may protect different substrings 19 of battery cells 18 of the battery 16'. As a non-limiting example, two battery circuit breakers 28 may be provided. A first of the two battery circuit breakers may be connected to the negative terminal 29 and a center terminal (as a non-limiting example, the positive terminal of battery cell 32) of the battery 16'. The second of the two battery circuit breakers 28 may be connected to the center terminal and the positive terminal 30 of the battery 16'. In this manner, a maximum current and/or maximum voltage experienced by a device and/or user shorting across the negative and positive terminals 29, 30 of a single battery circuit breaker 28 may be reduced.

The battery monitoring system control unit 12 tests the battery cells 18 (as a non-limiting example, battery cells 18(1)-18(64)) of the battery 16' in a sequential order. In this regard, the battery monitoring system control unit 12 first tests battery cell 18(1). The battery monitoring system control unit 12 then tests, in sequential order, battery cells 18(2), 18(3), 18(4), 18(5), . . . 18(63), and 18(64).

Each battery cell 18 may be tested as follows. The battery monitoring system control unit 12 instructs the battery monitoring device 14 assigned to the battery cell 18 to couple a current-inducing load to the subset 19 (as a non-limiting example, a battery cell substring) of the battery cells 18 monitored by the battery monitoring device 14. The battery monitoring system control unit 12 instructs the battery monitoring device 14 assigned to the battery cell 18 to measure the voltage of the battery cell 18. The battery monitoring system control unit 12 determines (or instructs the battery monitoring device 14 to determine) the ohmic value 17 of the battery cell 18 based on the measured voltage. The battery monitoring system control unit 12 decouples the current-inducing load from the subset 19 of the battery cells 18 to stop inducing the current through the subset 19 of the battery cells 18 monitored by the battery monitoring device 14 assigned to the battery cell 18.

The maximum operating temperature of a battery monitoring device 14 (as non-limiting examples, 14(1)-14(16)) in the example battery monitoring system 10' in FIG. 2 is defined by the ability of the battery monitoring device 14 to dissipate heat from successive tests of battery cells 18(1)-18(64). When a battery monitoring device 14 couples a current-inducing load to a subset 19 of the battery cells 18 of the battery 16', the current flowing through the resistive load of the battery monitoring device 14 generates an amount of heat (for example, a number of joules) that must be dissipated by the battery monitoring device 14.

When the battery cells 18 of the battery 16' are monitored in sequential order, the testing of each battery cell generates an amount of heat (i.e., a number of joules) in the resistive load of each battery monitoring device 14 during a shorter time interval. As a non-limiting example, when measured in sequential order an amount of heat is successively generated for each battery cell 18(1), 18(2), 18(3), 18(4) in a first time interval that must be dissipated by the battery monitoring device 14(1). Then, battery cells 18(5), 18(6), 18(7), 18(8) generate an amount of heat in a second time interval that must be dissipated by the battery monitoring device 14(2). It may be desired to provide for battery monitoring devices (including battery monitoring devices 14 in FIG. 2) to more effectively dissipate heat. This may allow the battery monitoring devices, for example, to be employed in higher operating temperature environments, if desired.

Figure 3:
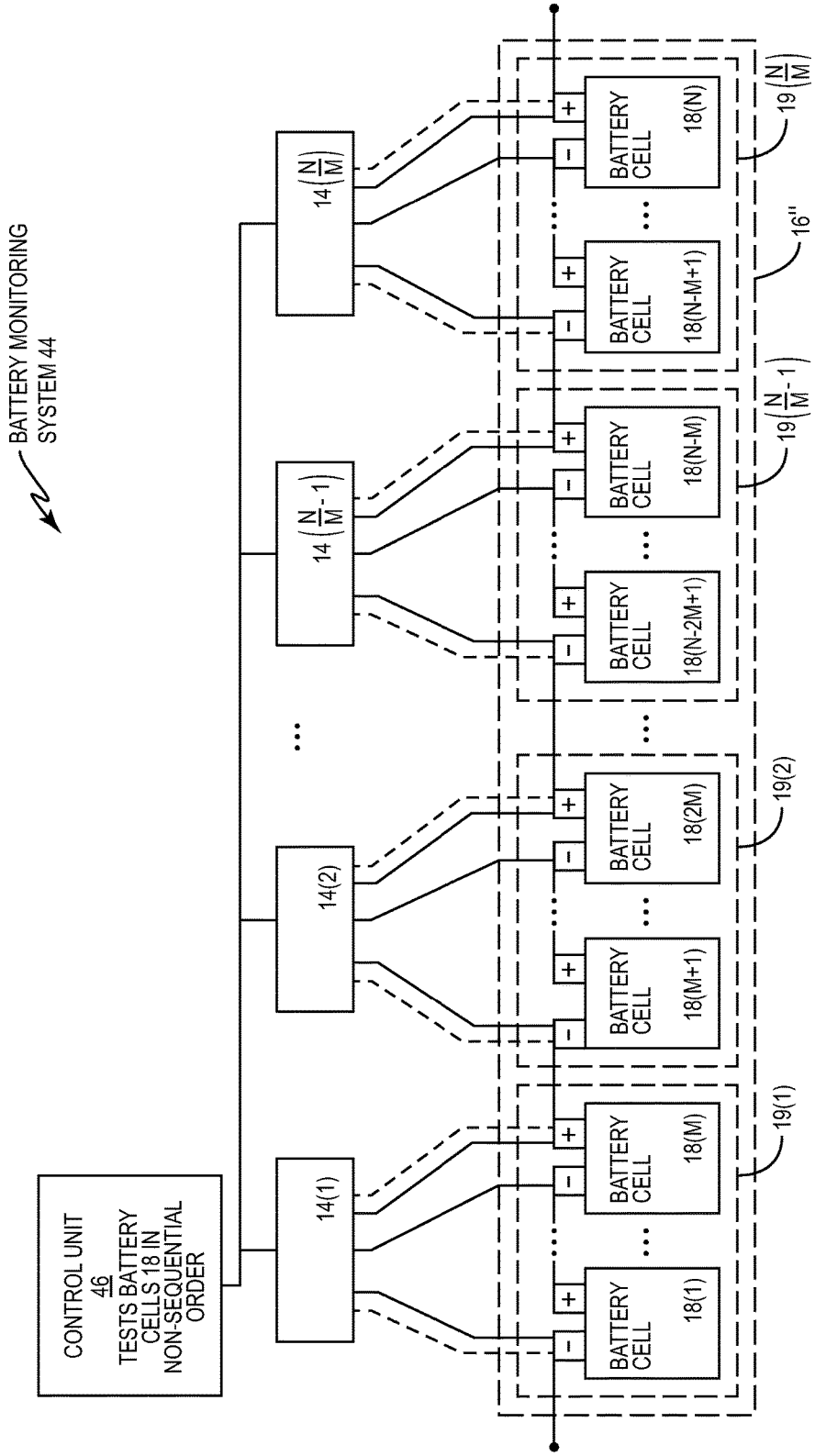
FIG. 3 is a block diagram of another exemplary battery monitoring system configured to test ohmic values of battery cells of a backup power supply in a non-sequential order.

In this regard, FIG. 3 provides an alternative exemplary battery monitoring system 44. As will be discussed in more detail below, the exemplary battery monitoring system 44 in FIG. 3 includes a battery monitoring system control unit 46 configured to instruct a plurality of battery monitoring devices 14 to test battery cells 18(1)-18(N) of a battery 16" in a non-sequential order. In this example, 'N' is the number of battery cells 18 provided in the battery 16". The battery monitoring system control unit 46 may be configured to instruct the battery monitoring devices 14 in this example to test the battery cells 18(1)-18(N) in a non-sequential order. The battery monitoring system control unit 46 is configured to instruct the battery monitoring devices 14 to test adjacent battery cells 18 of the battery 16" in non-sequential order. As will be discussed in more detail below, heat generated by the battery monitoring devices 14 may be dissipated more effectively by testing the battery cells 18 in a non-sequential order. In this manner, the maximum operating temperature of the battery monitoring devices 14 may be extended to higher maximum operating temperatures, and be used in elevated temperature environments, if desired.

As used herein, a "non-sequential order" is an order in which no "adjacent" battery cells 18 of a battery 16 are tested in "sequential" order. A second battery cell 18 is "adjacent" to a first battery cell 18 if there are no other battery cells 18 disposed in series (i.e., electrically coupled) between the first battery cell 18 and the second battery cell 18. A second battery cell 18 is "non-adjacent" (i.e., not adjacent) to a first battery cell 18 if there is at least one other battery cell 18 disposed in series (i.e., electrically coupled) between the first battery cell 18 and the second battery cell 18.

As used herein, a second battery cell 18 is tested in a "sequential" order (i.e., tested "sequentially") to a first battery cell 18 if the first battery cell 18 and the second battery cell 18 are "adjacent" and the first battery cell 18 is first tested and the second battery cell 18 is next tested, without any other battery cells 18 being tested after the first battery cell 18 is tested and before the second battery cell 18 is tested.

Thus, as used herein, a battery 16 of battery cells 18 is tested in a "non-sequential order" (i.e., tested "non-sequentially") if the order in which the battery cells 18 of the battery 16 are tested does not comprise a first battery cell 18 and a second battery cell 18 adjacent to (i.e., electrically coupled to without any other battery cells 18 disposed in series therebetween) the first battery cell 18 which is tested after the first battery cell 18 is tested and before any other battery cell 18 of the battery 16 is tested.

Non-sequential testing of the battery cells 18 of the battery 16 increases the time over which each battery monitoring device 14 will absorb and dissipate the amount of heat generated by the testing of the battery cells 18 assigned to that battery monitoring device 14. By increasing the time each battery monitoring device 14 has to recover after testing an assigned battery cell 18, each battery monitoring device 14 will have a greater amount of time to dissipate heat generated from each test. As a result, each battery monitoring device 14 may experience a reduced maximum operating temperature (as compared to a maximum operating temperature that would be experienced by the battery monitoring device due to sequential battery cell testing). In this manner, heat generated in the battery monitoring devices 14 from the testing of the ohmic values 17 of the battery cells 18 of the battery 16, 16', 16" may be more effectively dissipated.

As illustrated in FIG. 3, in the general case, the battery monitoring system 44 is comprised of N battery cells 18(1)-18(N). The battery monitoring system 44 may be comprised of a plurality of battery monitoring devices 14 for measuring the ohmic values 17 of the battery cells 18(1)-18(N). The battery cells 18(1)-18(N) are organized into individual subsets 19 (also referred to as a "battery cell substring 19"). Also in this example, the 'M' number of battery cells 18 provided in each subset 19 are electrically connected in series. Each subset 19 of battery cells 18 is monitored by a single battery monitoring device 14 in this example. Thus, there are "N/M" subsets 19(1)-19(N/M) of battery cells 18 in this example. Each subset 19(1)-19(N/M) is monitored by a respective battery monitoring device 14(1)-14(N/M). In contrast to the battery monitoring system control unit 12 illustrated in FIGS. 1 and 2, the battery monitoring system control unit 46 in FIG. 3 is configured to instruct the battery monitoring devices 14(1)-14(N/M) to test the battery cells 18(1)-18(N) of the battery 16" in a non-sequential order. In this manner, heat generated in the battery monitoring devices 14 from the testing may be more effectively dissipated.

As illustrated in FIG. 3, a battery monitoring device 14(1) may be configured to test the ohmic values 17 of battery cells 18 of a first battery cell subset 19(1) of the battery 16" (as a non-limiting example, battery cells 18(1)-18(M)). The battery monitoring device 14(2) may be configured to test the ohmic value 17 of each of the battery cells 18 of a second battery cell subset 19(2) (as a non-limiting example, battery cells 18(M+1)-18(2M)). The battery monitoring device 14(N/M−1) may be configured to test ohmic values 17 of the battery cells 18 of another battery cell subset 19((N/M)−1) (as a non-limiting example, battery cells 18(N−2M+1)-18(N−M)). The battery monitoring device 14(N/M) may be configured to test ohmic values 17 of the battery cells 18 of a further battery cell subset 19(N/M) (as a non-limiting example, battery cells 18(N−M+1)-18(N)) of the battery 16".

Figure 4:
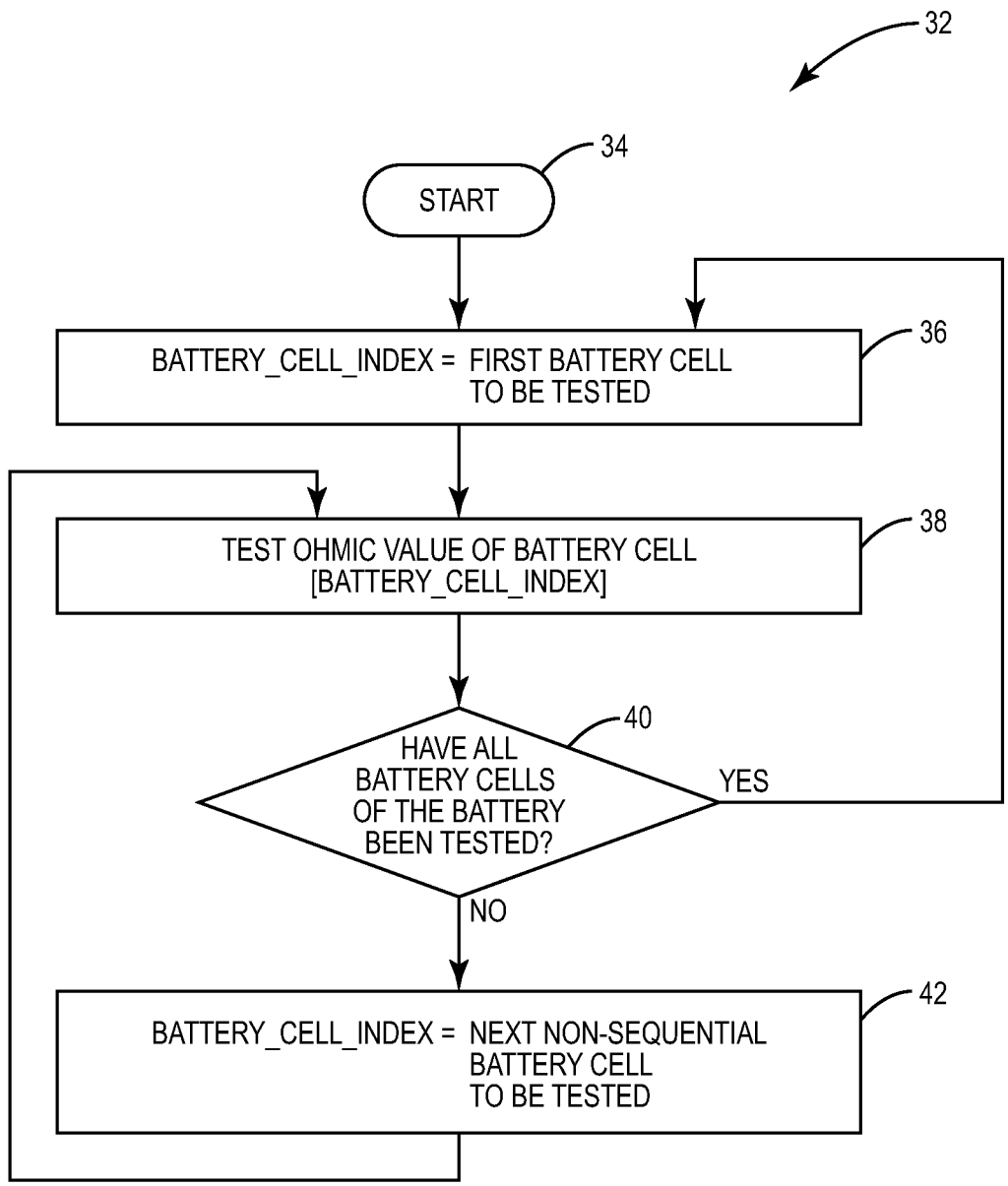
FIG. 4 is a flowchart illustrating an exemplary process for instructing a battery monitoring device(s) in the battery monitoring system of FIG. 3 to test ohmic values of battery cells of a backup power supply in a non-sequential order.
Figure 5:
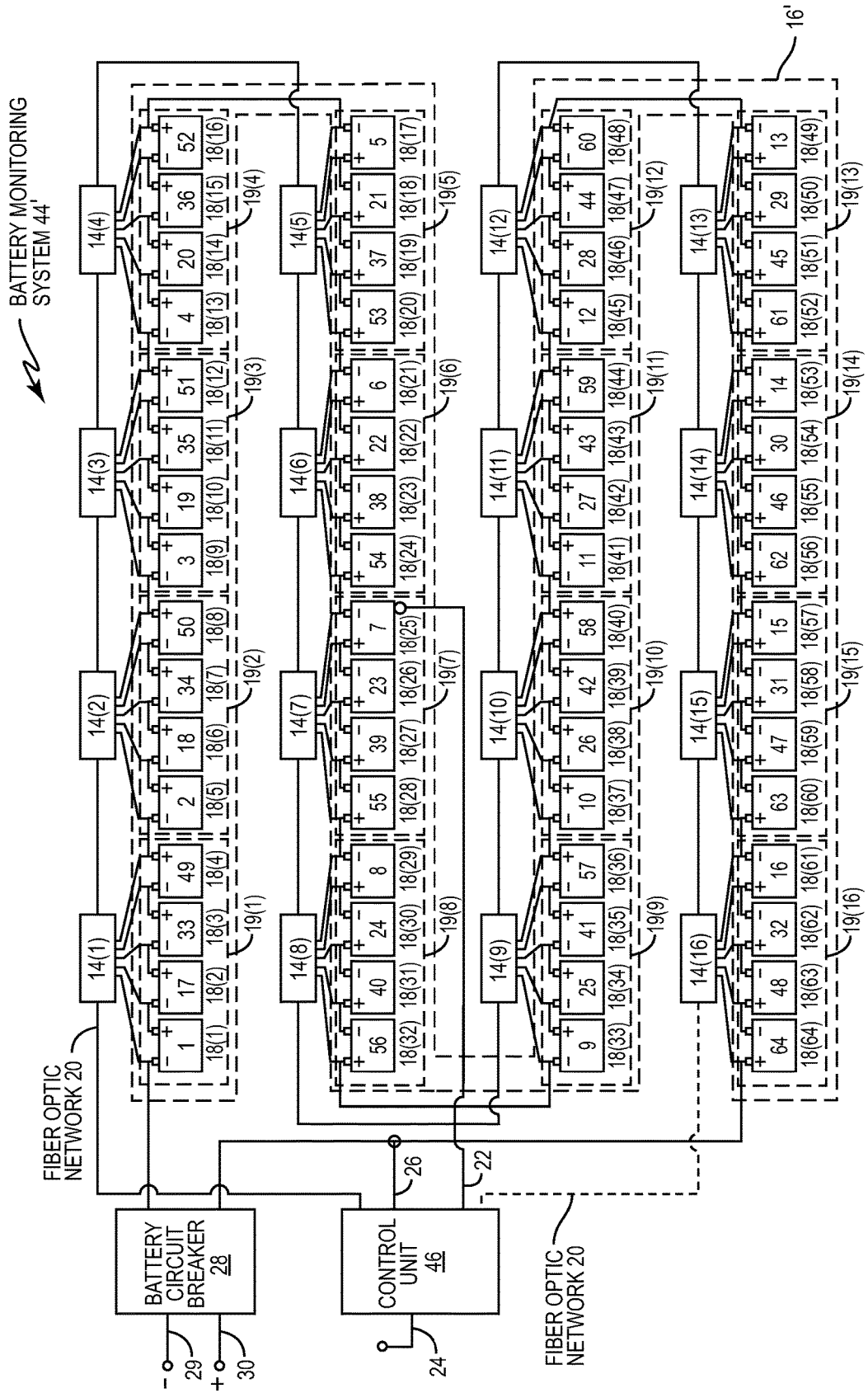
FIG. 5 is a block diagram of another exemplary battery monitoring system configured to test ohmic values of battery cells of a backup power supply in a non-sequential order.

In this regard, FIG. 4 illustrates an exemplary method 32 of testing battery cells 18 of a battery 16" in a non-sequential order. The method 32 starts at block 34. A battery cell index (BATTERY_CELL_INDEX) is set equal to an index of a first battery cell 18 to be tested (block 36). The ohmic value 17 of the battery cell 18 indicated by the battery cell index is tested (block 38). The tested ohmic value 17 may be an internal resistance, an internal impedance, and/or an internal conductance of the battery cell. If any of the battery cells 18 of the battery 16 have not been tested (block 40, NO), then the battery cell index is set to the index of a next non-sequential battery cell 18 to be tested (block 42). Thereafter, the ohmic value 17 of the next non-sequential battery cell 18 is tested (block 38). If all battery cells 18 of the battery 16 have been tested (block 40, YES), then the battery cell index is again set to the index of the first battery cell 18 to be tested, and the method 32 continues as herein described. In this regard, battery monitoring system 44' of FIG. 5 illustrates a battery monitoring system control unit 46 configured to instruct a plurality of battery monitoring devices 14(1)-14(16) to test an ohmic value 17 of each battery cell 18 of the same battery 16' in FIG. 2, but in a non-sequential order. In this manner, heat generated in the battery monitoring devices 14(1)-14(16) from the testing may be more effectively dissipated.

In one embodiment, the battery monitoring system control unit 46 may be configured to instruct a plurality of battery monitoring devices 14 to test the battery cells 18 of the battery 16 in a non-sequential order by instructing the battery monitoring devices 14 to not test adjacent battery cells 18 sequentially. A second battery cell 18 is adjacent to a first battery cell 18 if there are no other battery cells 18 disposed in series between the first battery cell 18 and the second battery cell 18. A second battery cell 18 is non-adjacent (i.e., not adjacent) to a first battery cell 18 if there is at least one other battery cell 18 disposed in series between the first battery cell 18 and the second battery cell 18.

Each battery monitoring device 14 may be configured to test a subset 19 of battery cells 18 comprising a unique battery cell substring. In other words, a subset 19(1) comprising a unique battery cell substring tested by and assigned to a battery monitoring device 14(1) may comprise a unique set of battery cells 18(1), 18(2), 18(3), 18(4) among the plurality of battery cells 18(1)-18(64) of the battery 16'. The battery monitoring system control unit 46 may be configured to instruct each of the battery monitoring devices 14 to test the unique set of battery cells 18 in series of each battery cell substring 19 assigned to the respective battery monitoring device 14. The battery monitoring system control unit 46 may be configured to repeat the instruction after all the battery cells 18(1)-18(64) have been tested.

With continuing reference to FIG. 5, the battery monitoring system control unit 46 may be configured to instruct the battery monitoring device 14(1) among the plurality of battery monitoring devices 14(1)-14(16) to test a first battery cell 18(1), as a non-limiting example. The battery monitoring system control unit 46 may be further configured to instruct a battery monitoring device 14(2) among the plurality of battery monitoring devices 14(1)-14(16) to test a next non-sequential battery cell 18 (as a non-limiting example, battery cell 18(5)). The battery monitoring system control unit 46 may be further configured to repeatedly instruct a battery monitoring device 14 among the battery monitoring devices 14(1)-14(16) to test a next non-sequential battery cell 18 until all battery cells 18(1)-18(64) of the battery 16' have been tested.

An example of a non-sequential testing order of the battery cells 18 in the battery monitoring system 44' in FIG. 5 can be described generically by formula for any given number of battery cells 18. The battery 16' in FIG. 5 may be described to include 'N' battery cells, where 'N' is an integer greater than or equal to four (4) to allow for non-sequential testing. As discussed above, each subset 19 of the battery cells 18 may include 'M' number of battery cells 18, wherein 'M' is an integer greater than or equal to two (2). Thus, there are "N/M" subsets 19(1)-19(N/M). In one embodiment, if battery monitoring system 44' is configured to have the same number of the battery cells 18(1)-18(N) included in each subset 19(1)-19(N/M) (i.e., N mod M=0), the order in which the battery cells 18(1)-18(N) can be non-sequentially tested may be determined as follows:

$$(N/M)[(I-1) \bmod M] + \mathrm{floor}[(I-1)/M] + 1$$

wherein I is an integer counter from 1 to N. In a further embodiment, M may equal four (4).

The battery monitoring system control unit 46 may be configured to instruct the battery monitoring devices 14(1)-14(16) to test each battery cell 18 by coupling a current-inducing load to a battery cell substring 19 comprising the battery cell 18 to induce a current through the battery cell substring 19. The battery monitoring system control unit 46 may then instruct the battery monitoring device 14 to measure a voltage of the battery cell 18. The voltage may be a voltage between the negative terminal of the battery cell 18 and the positive terminal of the battery cell 18. The battery monitoring system control unit 46 and/or the battery monitoring device 14 may then determine the ohmic value 17 of the battery cell 18 based on the measured voltage. The battery monitoring system control unit 46 may then instruct the battery monitoring device 14 to decouple the current-inducing load from the battery cell substring 19 to stop inducing the current through the battery cell substring 19.

The battery monitoring system 44' may also comprise a battery circuit breaker (BCB) 28. The BCB 28 may be configured to be coupled to the battery 16' to protect the battery 16' from overcurrents. The battery monitoring system 44' may also comprise a charger (not shown) for charging the battery cells 18 of the battery 16'. The battery monitoring system 44 may also comprise the battery 16'.

In one embodiment, all battery cells 18 of the battery 16, 16', 16" are tested once during each day. Failures of a battery cell 18 of the battery 16, 16', 16" may occur during a two-day or greater period of time. As a result, the testing of each battery cell 18 once per day may detect a failure of a battery cell 18 as the failure is occurring, without multiple days passing before the failure of the battery cell 18 is detected. In contrast, testing battery cells using a longer interval (as a non-limiting example, once a week) may result in a battery cell 18 failure being undetected prior to a needed use of the battery 16, 16', 16". Testing battery cells 18 using a shorter interval (as a non-limiting example, multiple times per day) may unnecessarily draw a greater amount of power from the battery cells 18 than is needed for detecting battery cell 18 failure.

Figure 6:
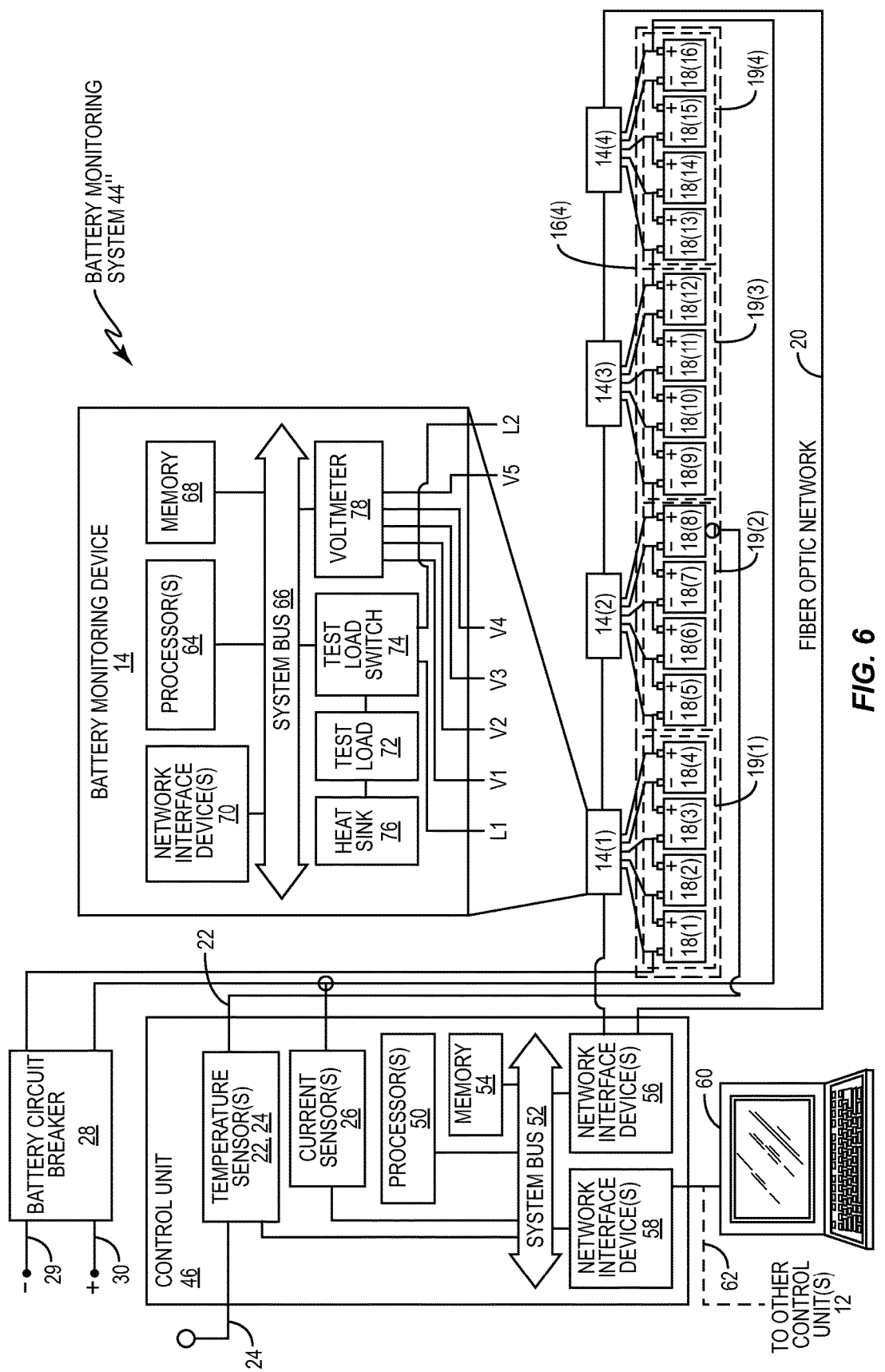
FIG. 6 is a block diagram of an exemplary processor-based system that includes battery monitoring devices and/or control unit(s) for testing ohmic values of battery cells of a backup power supply in a non-sequential order according to embodiments disclosed herein.

The non-sequential testing of ohmic values 17 of battery cells 18 of the battery 16, 16', 16", 16(4), according to embodiments disclosed herein, may be provided in or integrated into any processor-based device. In this regard, FIG. 6 illustrates an example of a processor-based battery monitoring system 44" that can employ the method 32 of FIG. 4, and the battery monitoring system control unit 46 and/or the battery monitoring device(s) 14 of FIG. 3 and/or FIG. 5. In this example, the battery monitoring system 44" comprises at least one battery monitoring system control unit 46 and a plurality of battery monitoring devices 14 (as a non-limiting example, battery monitoring devices 14(1)-14(4)). The battery monitoring system 44" may also comprise a battery circuit breaker (BCB) 28 for guarding the battery 16(4) from overcurrents. In this example, the battery monitoring system control unit 46 includes one or more processor(s) 50. The processor(s) 50 is coupled to a system bus 52. As is well known, the battery monitoring system control unit 46 communicates with other system devices on the system bus 52 by exchanging address, control, and data information over the system bus 52. For example, the processor(s) 50 can communicate memory access requests to a memory 54 across the system bus 52. Although not illustrated in FIG. 6, multiple system buses 52 may be provided wherein each system bus 52 constitutes a different fabric.

Other devices can be connected to the system bus 52. As illustrated in FIG. 6, at least one battery cell temperature sensor 22 may be coupled to the system bus 52 for receiving battery temperature measurements of one or more battery cells 18 of the battery 16(4). An ambient temperature sensor 24 may also be coupled to the system bus 52. At least one current sensor 26 for measuring the currents of the battery 16(4) may also be coupled to the system bus 52.

At least one network interface device(s) 56 may be coupled to the fiber optic network 20 to allow the battery monitoring system control unit 46 to communicate with the battery monitoring devices 14. Because the fiber optic network 20 is a fiber optic network, and not an electricity-conducting network, currents of the battery 16(4) flowing through the fiber optic network 20 are avoided.

The battery monitoring system control unit 46 may also comprise network interface device(s) 58 for communicating with a client computer 60 for accessing the battery monitoring system control unit 46 for monitoring and/or configuration by a user. The client computer 60 and/or battery monitoring system control unit 46 may alert the user to an impending failure or failure of a battery cell 18. The network interface device(s) 58 may be attached to a network 62. In one embodiment, the network 62 may be an RS-485 network, as a non-limiting example. Alternatively, the network 62 may be an Internet Protocol (IP) network or other network allowing other client computers 60 to access the battery monitoring system control unit 46. The network 62 may also allow the client computer 60 to access other battery monitoring system control units 46. The network interface device(s) 58 can be any device(s) configured to allow exchange of data to and from the network 62. The network 62 can be any type of network, including but not limited to, a wired or wireless network, a private or public network, a local area network (LAN), a wide area network (WLAN), and the Internet. The network interface device(s) 56, 58 can be configured to support any type of communication protocol desired. The client computer 60 may be a desktop computer, a laptop computer, a tablet, or other client device.

The fiber optic network 20 may alternatively be provided as any type of network allowing the network interface device(s) 56 of the battery monitoring system control unit 46 to communicate with the battery monitoring device(s) 14 (as non-limiting examples, battery monitoring devices 14(1)-14(4)). Portions of the network may be electricity conducting. However, the network may comprise electrically isolating components so that electricity stored in the battery cells 18 (as non-limiting examples, 18(1)-18(16)) is prevented from being conducted through the network connecting the battery monitoring device(s) 14 (as non-limiting examples, 14(1)-14(4)) and the network interface device(s) 56 of the control unit 46.

As also illustrated in FIG. 6, the battery monitoring device 14 comprises processor(s) 64 coupled to a system bus 66. As is well known, the processor(s) 64 also communicate with other devices on the system bus 66 by exchanging address, control, and data information over the system bus 66. For example, the processor(s) 64 can communicate memory access requests to a memory 68. The battery monitoring device 14 also comprises network interface device(s) 70 configured to be coupled to the fiber optic network 20. The battery monitoring device 14 also comprises a resistive test load 72 used for inducing a current in the subset 19(1) of battery cells 18(1)-18(4) to which the battery monitoring device 14 is coupled. The resistive test load 72 is coupled to each end of a subset 19 of the battery cells 18 connected in series. The battery monitoring device 14 also comprises a test load switch 74 for coupling the resistive test load 72 to current leads L1, L2 for inducing a current in the subset 19 of the battery cells 18 in series. The test load switch 74 may be any kind of switch, including a relay, a transistor, a field effect transistor (FET), or any other type of switch for coupling the resistive test load 72 to the subset 19 of the battery cells 18.

The battery monitoring device 14 also comprises a heat sink 76 for receiving dissipating heat generated by the resistive test load 72 when the resistive test load 72 is coupled to the subset 19 of the battery cells 18. The battery monitoring device 14 also comprises a voltmeter 78 having a plurality of voltage leads V1-V5, for measuring the voltages of each battery cell 18(1)-18(4) of the subset 19 of the battery cells 18, and to which the battery monitoring device 14 is configured to be coupled.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The battery monitoring system control units and battery monitoring devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a processor, a DSP, an Application Specific Integrated Circuit (ASIC), an FPGA or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A battery monitoring system control unit configured to control a plurality of battery monitoring devices, each battery monitoring device configured to be coupled to a subset of a plurality of battery cells electrically connected in series in a sequential order to form a battery, the battery monitoring system control unit further configured to instruct the plurality of battery monitoring devices to test an ohmic value of each battery cell of the plurality of battery cells of the battery in a non-sequential order in which no adjacent battery cell among the plurality of battery cells is instructed to test an ohmic value in a sequential order, wherein each subset of the plurality of battery cells includes M battery cells, wherein M is an integer greater than or equal to two (2), wherein the total number of battery cells of the battery includes N battery cells, wherein N is an integer greater than or equal to four (4), and wherein the order in which each battery cell I among the N battery cells is configured to be tested is $(N/M)[(I-1) \bmod M]+\mathrm{floor}[(I-1)/M]+1$, wherein I is an integer between 1 and N inclusive.

2. The battery monitoring system control unit of claim 1 configured to instruct the plurality of battery monitoring devices to not test adjacent battery cells among the plurality of battery cells in a sequential order.

3. The battery monitoring system control unit of claim 1, wherein the battery comprises a plurality of battery cell substrings each comprising a unique set of battery cells among the plurality of battery cells, each of the battery monitoring devices configured to test a unique battery cell substring among the plurality of battery cell substrings assigned to the respective battery monitoring device.

4. The battery monitoring system control unit of claim 3 configured to instruct each of the plurality of battery monitoring devices to test the unique set of battery cells in series of each battery cell substring assigned to the respective battery monitoring device.

5. The battery monitoring system control unit of claim 1 configured to repeat the instruction after all the battery cells have been tested.

6. The battery monitoring system control unit of claim 1, configured to:

instruct a battery monitoring device among the plurality of battery monitoring devices to test a first battery cell; and instruct a battery monitoring device among the plurality of battery monitoring devices to test a next non-sequential battery cell.

7. The battery monitoring system control unit of claim 6, further configured to repeatedly instruct a battery monitoring device among the plurality of battery monitoring devices to test a next non-sequential battery cell until all battery cells of the battery have been tested.

8. The battery monitoring system control unit of claim 1 configured to instruct the plurality of battery monitoring devices to test each battery cell of the battery by:

coupling a current-inducing load to a battery cell substring comprising the battery cell to induce a current through the battery cell substring;

measuring a voltage of the battery cell;

determining the ohmic value of the battery cell based on the measured voltage; and decoupling the current-inducing load from the battery cell substring to stop inducing the current through the battery cell substring.

9. A battery monitoring system, comprising:

a battery comprised of a plurality of battery cells electrically connected in series;

a plurality of battery monitoring devices each configured to be coupled to a subset of the plurality of battery cells; and at least one battery monitoring system control unit configured to instruct the plurality of battery monitoring devices to test an ohmic value of each battery cell of the plurality of battery cells of the battery in a non-sequential order in which no adjacent battery cell among the plurality of battery cells is instructed to test an ohmic value in a sequential order, wherein each subset of the plurality of battery cells includes M battery cells, wherein M is an integer greater than or equal to two (2), wherein the total number of battery cells of the battery includes N battery cells, wherein N is an integer greater than or equal to four (4), and wherein the order in which each battery cell I among the N battery cells is configured to be tested is $(N/M)[(I-1) \bmod M]+\mathrm{floor}[(I-1)/M]+1$, wherein I is an integer between 1 and N inclusive.

10. The battery monitoring system of claim 9, wherein the at least one battery monitoring system control unit is configured to instruct the plurality of battery monitoring devices to not test adjacent battery cells among the plurality of battery cells in a sequential order.

11. The battery monitoring system of claim 9, wherein the battery comprises a plurality of battery cell substrings each comprising a unique set of battery cells among the plurality of battery cells, each of the battery monitoring devices configured to test a unique battery cell substring among the plurality of battery cell substrings assigned to the respective battery monitoring device.

12. The battery monitoring system of claim 11, the at least one battery monitoring system control unit configured to instruct each of the plurality of battery monitoring devices to test the unique set of battery cells in series of each battery cell substring assigned to the respective battery monitoring device.

13. The battery monitoring system of claim 9, the at least one battery monitoring system control unit configured to repeat the instruction after all the battery cells have been tested.

14. The battery monitoring system of claim 9, the at least one battery monitoring system control unit configured to:

instruct a battery monitoring device among the plurality of battery monitoring devices to test a first battery cell; and instruct a battery monitoring device among the plurality of battery monitoring devices to test a next non-sequential battery cell.

15. The battery monitoring system of claim 14, the at least one battery monitoring system control unit further configured to repeatedly instruct a battery monitoring device among the plurality of battery monitoring devices to test a next non-sequential battery cell until all battery cells of the battery have been tested.

16. The battery monitoring system of claim 9, the at least one battery monitoring system control unit configured to instruct the plurality of battery monitoring devices to test each battery cell by:

coupling a current-inducing load to a battery cell substring comprising the battery cell to induce a current through the battery cell substring;

measuring a voltage of the battery cell;

determining the ohmic value of the battery cell based on the measured voltage; and decoupling the current-inducing load from the battery cell substring to stop inducing the current through the battery cell substring.

17. A method of a battery monitoring system control unit, comprising instructing a plurality of battery monitoring devices to test a plurality of battery cells electrically connected in series in a sequential order to form a battery by testing an ohmic value of each battery cell of the plurality of battery cells of the battery in a non-sequential order in which no adjacent battery cell among the plurality of battery cells is instructed to test an ohmic value in a sequential order, wherein the plurality of battery cells comprise a plurality of subsets of battery cells, wherein each of the plurality of subsets of battery cells includes M battery cells, wherein M is an integer greater than or equal to two (2), wherein the total number of battery cells of the battery includes N battery cells, wherein N is an integer greater than or equal to four (4), and wherein the instructing a plurality of battery monitoring devices comprises instructing the plurality of battery monitoring devices to test the plurality of battery cells in a non-sequential order, wherein the non-sequential order in which each battery cell I among the N battery cells is configured to be tested is $(N/M)[(I-1) \bmod M]+\text{floor}[(I-1)/M]+1$, wherein I is an integer between 1 and N inclusive.

18. The method of claim 17, comprising instructing the plurality of battery monitoring devices to not test adjacent battery cells among the plurality of battery cells in a sequential order.

19. The method of claim 17,
wherein the battery comprises a plurality of battery cell substrings each comprising a unique set of battery cells among the plurality of battery cells,
comprising instructing each battery monitoring device among the plurality of battery monitoring devices to test the unique set of battery cells in series of each battery cell substring assigned to the respective battery monitoring device.

20. The method of claim 17 further comprising repeating the instruction after all the battery cells have been tested.

21. The method of claim 17, comprising:
instructing a battery monitoring device among the plurality of battery monitoring devices to test a first battery cell; and
instructing a battery monitoring device among the plurality of battery monitoring devices to test a next non-sequential battery cell.

22. The method of claim 21, further comprising repeatedly instructing a battery monitoring device among the plurality of battery monitoring devices to test a next non-sequential battery cell until all battery cells of the battery have been tested.

23. The method of claim 17, wherein instructing the plurality of battery monitoring devices to test each battery cell comprises:
coupling a current-inducing load to a battery cell substring comprising the battery cell to induce a current through the battery cell substring;
measuring a voltage of the battery cell;
determining the ohmic value of the battery cell based on the measured voltage; and
decoupling the current-inducing load from the battery cell substring to stop inducing the current through the battery cell substring.

24. A non-transitory computer-readable medium having stored thereon computer-executable instructions to cause a processor to implement a method for controlling a plurality of battery monitoring devices to test an ohmic value of each battery cell of a battery, comprising:
instructing a plurality of battery monitoring devices to test a plurality of battery cells electrically connected in series in a sequential order to form a battery by testing an ohmic value of each battery cell of the plurality of battery cells of the battery in a non-sequential order in which no adjacent battery cell among the plurality of battery cells is instructed to test an ohmic value in a sequential order, wherein the plurality of battery cells comprise a plurality of subsets of battery cells, wherein each of the plurality of subsets of battery cells includes M battery cells, wherein M is an integer greater than or equal to two (2), wherein the total number of battery cells of the battery includes N battery cells, wherein N is an integer greater than or equal to four (4), and wherein the instructing a plurality of battery monitoring devices comprises instructing the plurality of battery monitoring devices to test the plurality of battery cells in a non-sequential order, wherein the non-sequential order in which each battery cell I among the N battery cells is configured to be tested is $(N/M)[(I-1) \bmod M]+\text{floor}[(I-1)/M]+1$, wherein I is an integer between 1 and N inclusive.

25. A battery monitoring system for testing ohmic values of battery cells of a battery, comprising:
a plurality of battery monitoring devices, each battery monitoring device configured to be coupled to a subset of a plurality of battery cells electrically connected in series in a sequential order to form a battery, wherein each battery monitoring device comprises a plurality of current leads configured to be coupled to the subset of battery cells assigned to the battery monitoring device to induce a current through the subset of battery cells; wherein each battery monitoring device further comprises a plurality of voltage leads configured to be coupled to the subset of battery cells assigned to the battery monitoring device to measure a voltage of each battery cell of the subset;
a battery monitoring system control unit configured to control the plurality of battery monitoring devices, wherein each of the plurality of battery monitoring devices is configured to be coupled to a fiber optic loop for communications with the battery monitoring system control unit, wherein the battery monitoring system control unit is further configured to receive at least one pilot cell temperature measurement of the plurality of battery cells, wherein the battery monitoring system control unit is further configured to receive at least one battery current measurement of the battery, and
wherein the battery monitoring system control unit is further configured to instruct the plurality of battery monitoring devices to test an ohmic value of each battery cell of the plurality of battery cells of the battery in a non-sequential order in which no adjacent battery cell among the plurality of battery cells is instructed to test an ohmic value in a sequential order, wherein each subset of a plurality of battery cells includes M battery cells, wherein M is an integer greater than or equal to two (2), wherein the total number of battery cells of the battery includes N battery cells, wherein N is an integer greater than or equal to four (4), and wherein the order in which each battery cell I among the N battery cells is configured to be tested is $(N/M)[(I-1) \bmod M]+\text{floor}[(I-1)/M]+1$, wherein I is an integer between 1 and N inclusive.

26. The battery monitoring system of claim 25, wherein the battery monitoring system control unit is further configured to:

instruct a battery monitoring device among the plurality of battery monitoring devices to test a first battery cell; and instruct a battery monitoring device among the plurality of battery monitoring devices to test a next non-sequential battery cell.

27. The battery monitoring system of claim 26, wherein the battery monitoring system control unit is further configured to repeatedly instruct a battery monitoring device among the plurality of battery monitoring devices to test a next non-sequential battery cell until all battery cells of the battery have been tested.

28. The battery monitoring system of claim 25, wherein M equals four (4).

29. The battery monitoring system of claim 25 configured to instruct the plurality of battery monitoring devices to test each battery cell by:

coupling a current-inducing load to a battery cell substring comprising the battery cell to induce a current through the battery cell substring;

measuring a voltage of the battery cell;

determining the ohmic value of the battery cell based on the measured voltage; and decoupling the current-inducing load from the battery cell substring to stop inducing the current through the battery cell substring.

30. The battery monitoring system of claim 25, further comprising a battery circuit breaker (BCB) configured to be coupled to the battery to protect the battery from overcurrents.

31. The battery monitoring system of claim 25, further comprising the battery.

32. A battery monitoring system control unit configured to control a plurality of battery monitoring devices, each battery monitoring device configured to be coupled to a subset of a plurality of battery cells electrically connected in series in a sequential order to form a battery, the battery monitoring system control unit further configured to instruct the plurality of battery monitoring devices to test an ohmic value of each battery cell of the plurality of battery cells of the battery in a non-sequential order in which no adjacent battery cell among the plurality of battery cells is instructed to test an ohmic value in a sequential order, wherein the plurality of battery cells comprise a plurality of subsets of battery cells, wherein each of the plurality of subsets of battery cells includes M battery cells, wherein M is an integer greater than or equal to two (2), wherein the total number of battery cells of the battery includes N battery cells, wherein N is an integer greater than or equal to four (4), and wherein the battery monitoring control unit is further configured to test each of the N battery cells in a non-sequential order, and wherein the non-sequential order comprises:

a first battery cell from a first subset of the plurality of subsets of battery cells;

a first battery cell from a second subset of the plurality of subsets of battery cells;

wherein a second battery cell from the first subset of the plurality of subsets of battery cells is not tested before at least a first battery cell is tested from the second subset of the plurality of subsets of battery cells; and wherein the non-sequential order comprises testing the first single battery cell from a first subset of the plurality of subsets of battery cells before testing the first battery cell from the second subset of the plurality of subsets.

33. A battery monitoring system control unit configured to control a plurality of battery monitoring devices, each battery monitoring device configured to be coupled to a subset of a plurality of battery cells electrically connected in series in a sequential order to form a battery, the battery monitoring system control unit further configured to instruct the plurality of battery monitoring devices to test an ohmic value of each battery cell of the plurality of battery cells of the battery in a non-sequential order in which no adjacent battery cell among the plurality of battery cells is instructed to test an ohmic value in a sequential order, wherein the plurality of battery cells comprise a plurality of subsets of battery cells, wherein each of the plurality of subsets of battery cells includes M battery cells, wherein M is an integer greater than or equal to two (2), wherein the total number of battery cells of the battery includes N battery cells, wherein N is an integer greater than or equal to four (4), and wherein the battery monitoring control unit is further configured to test each of the N battery cells in a non-sequential order, and wherein the non-sequential order comprises:

a first battery cell from a first subset of the plurality of subsets of battery cells;

a first battery cell from a second subset of the plurality of subsets of battery cells;

wherein a second battery cell from the first subset of the plurality of subsets of battery cells is not tested before at least a first battery cell is tested from the second subset of the plurality of subsets of battery cells; and wherein the battery monitoring control unit is further configured to test each of the N battery cells in a non-sequential order, wherein the non-sequential order comprises:

testing only a single battery cell from a first subset of the plurality of subsets of battery cells during a first time period;

testing only a single battery cell from a second subset of the plurality of subsets of battery cells during a second time period after the first time period; and wherein a second battery cell from the first subset of the plurality of subsets of battery cells is not tested before at least a first battery cell is tested from the second subset of the plurality of subsets of battery cells.

* * * * *